United States Patent
Burukhin

(10) Patent No.: US 11,636,064 B2
(45) Date of Patent: Apr. 25, 2023

(54) COMPRESSION OF LOCALIZED FILES

(71) Applicant: Microsoft Technology Licensing, LLC, Redmond, WA (US)

(72) Inventor: Anatoliy Burukhin, Redmond, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 17/374,544

(22) Filed: Jul. 13, 2021

(65) Prior Publication Data

US 2023/0021891 A1     Jan. 26, 2023

(51) Int. Cl.
| | |
|---|---|
| G06F 16/11 | (2019.01) |
| G06F 16/17 | (2019.01) |
| G06F 16/16 | (2019.01) |
| G06F 16/174 | (2019.01) |

(52) U.S. Cl.
CPC .......... G06F 16/116 (2019.01); G06F 16/162 (2019.01); G06F 16/173 (2019.01); G06F 16/1756 (2019.01)

(58) Field of Classification Search
CPC .. G06F 16/116; G06F 16/162; G06F 16/1756; G06F 16/173
See application file for complete search history.

(56) References Cited

U.S. PATENT DOCUMENTS

| | | |
|---|---|---|
| 7,516,442 B2 | 4/2009 | Wu et al. |
| 7,663,511 B2 | 2/2010 | Burukhin |
| 8,595,710 B2 | 11/2013 | Aldahleh et al. |

(Continued)

FOREIGN PATENT DOCUMENTS

| | | |
|---|---|---|
| CN | 101364235 A | 2/2009 |
| EP | 1647883 A1 | 4/2006 |
| WO | 2018103490 A1 | 6/2018 |

OTHER PUBLICATIONS

"Data Differencing", Retrieved from: https://en.wikipedia.org/wiki/Data_differencing, Retrieved Date: Jun. 8, 2021, 2 Pages.
"Delta Encoding", Retrieved from: https://en.wikipedia.org/wiki/Delta_encoding, Retrieved Date: Jun. 8, 2021, 5 Pages.
"Diff", Retrieved from: https://en.wikipedia.org/wiki/Diff#Context_format, Retrieved Date: Jun. 8, 2021, 12 Pages.
"Longest Common Subsequence Problem", Retrieved from: https://en.wikipedia.org/wiki/Longest_common_subsequence_problem, Retrieved Date: Jun. 8, 2021, 12 Pages.

(Continued)

*Primary Examiner* — Tamara T Kyle
*Assistant Examiner* — Michal Bogacki
(74) *Attorney, Agent, or Firm* — NovoTechIP International PLLC

(57) ABSTRACT

A method for compressing a first application file and second application file includes accessing the first and the second application files, the first application file being in a first language and the second application being in a second language and being a counterpart of the first application file, decompressing the first and second application files to access internal files for the first and the second application files, comparing one of the first internal files to one of the second internal files, upon determining that the first internal file is identical to the second internal file, copying one of the internal files to an output folder, and upon determining that the files are not identical, copying both of the internal files to the output folder, or executing a differencing procedure on the first and second internal files to identify differences between them, storing data about the differences in the output folder, and compressing the output folder into one output file.

19 Claims, 7 Drawing Sheets

(56) References Cited

U.S. PATENT DOCUMENTS

| | | | | |
|---|---|---|---|---|
| 8,862,555 | B1* | 10/2014 | Xu | G06F 16/1756 |
| | | | | 707/687 |
| 9,619,482 | B1* | 4/2017 | Kothari | H04L 9/085 |
| 2006/0136907 | A1 | 6/2006 | Bennett et al. | |
| 2010/0251227 | A1 | 9/2010 | Elkhadiri | |
| 2016/0203151 | A1* | 7/2016 | Burukhin | H03M 7/3088 |
| | | | | 707/693 |
| 2016/0203154 | A1 | 7/2016 | Burukhin | |
| 2017/0249330 | A1* | 8/2017 | Chung | G06F 16/27 |
| 2017/0337213 | A1* | 11/2017 | Butt | G06F 16/1748 |
| 2018/0196823 | A1* | 7/2018 | Borden | G06F 16/1756 |
| 2021/0012002 | A1* | 1/2021 | Rosenthal | G06F 11/1451 |
| 2021/0064699 | A1 | 3/2021 | Burukhin | |
| 2021/0349916 | A1* | 11/2021 | Ofenloch | G06F 16/2282 |

OTHER PUBLICATIONS

"Office Open XML file formats", Retrieved from: https://en.wikipedia.org/wiki/Office_Open_XML_file_formats, Retrieved Date: Jun. 8, 2021, 9 Pages.

"What is a DOCX file?", Retrieved from: http://web.archive.org/web/20210509075520/https://docs.fileformat.com/word-processing/docx/, May 9, 2021, 4 Pages.

"XML Tree", Retrieved from: https://web.archive.org/web/20210521162116/https://www.w3schools.com/xml/xml_tree.asp, May 21, 2021, 7 Pages.

"International Search Report & Written Opinion issued in PCT Application No. PCT/US22/035399", dated Sep. 23, 2022, 12 Pages.

* cited by examiner

200

US 11,636,064 B2

COMPRESSION OF LOCALIZED FILES

BACKGROUND

Many software applications include a large number of files that are associated with the application. Some of these files include templates provided for enabling the user to perform certain tasks easier and more efficiently. For example, a word processing application (e.g., Microsoft Word®) includes individual template files for creating a resume, cover letter, calendar, brochure, and the like. With software applications becoming more user friendly and providing more features, the number of applications files associated with each application has steadily increased. This has resulted in increased sizes of the final software applications.

Moreover, many software applications are provided in different languages to offer the application to global customers. Offering a software application in multiple languages often requires localization of application files (e.g., localization of template files). The localization results in each application file being provided in each localized language. As a result, localization multiplies the number of application files by the number of locales. If an application file needs to be available in many different languages, the number and size of the application files may significantly increase, leading to larger applications. Thus, the total size of the localized application files may contribute significantly to the size of the final application. This may be especially true for applications that provide support for language localization for a large number of languages. As a result, it may be advantageous to use compression techniques to reduce the size of localized files used in an application. While a variety of compression technologies exist for compressing files, however, many are not well suited for compressing localized application files, such as localized template files.

Hence, there is a need for an improved method and system compressing and decompressing localized application files.

SUMMARY

In one general aspect, the instant disclosure presents a data processing system having a processor and a memory in communication with the processor where the memory comprises executable instructions that, when executed by the processors, cause the data processing system to perform multiple functions. The function may include accessing a first application file and a second application file, the first application file being in a first language and the second application file being in a second language, the second application file having a same structure and providing a same function as the first application file, but the same function being provided in the second language by the second application file, accessing one or more first internal files for the first application file and one or more second internal files for the second application file, the one or more first internal files being one or more files that are included within a first software code associated with the first application file and the one or more second internal files being one or more files that are included within a second software code associated with the second application file, comparing at least one of the one or more first internal files to one of the one or more second internal files to determine if the at least one of the one of the one or more first internal files is identical to the one of the one or more second internal files, upon determining that the at least one of the one of the one or more first internal files is not identical to the one of the one or more second internal files, perform at least one of copying both of the at least one of the one of the one or more first internal files and the one of the one or more second internal files to the output folder, or executing a differencing procedure on the at least one of the one of the one or more first internal files and the one of the one or more second internal files to identify one or more differences between the at least one of the one of the one or more first internal files and the one of the one or more second internal files, and storing data about the one or more differences in the output folder and compressing data stored in the output folder into one output file.

In yet another general aspect, the instant disclosure describes a method for compressing a first application file and second application file. The method may include accessing the first application file and the second application file, the first application file being in a first language and the second application file being in a second language, the second application file having a same structure and providing a same function as the first application file, but the same function being provided in the second language by the second application file, accessing one or more first internal files for the first application file and one or more second internal files for the second application file, the one or more first internal files being one or more files that are included within a first software code associated with the first application file and the one or more second internal files being one or more files that are included within a second software code associated with the second application file, comparing at least one of the one or more first internal files to one of the one or more second internal files to determine if the at least one of the one of the one or more first internal files is identical to the one of the one or more second internal files, upon determining that the at least one of the one of the one or more first internal files is not identical to the one of the one or more second internal files, perform at least one of copying both of the at least one of the one of the one or more first internal files and the one of the one or more second internal files to the output folder, or executing a differencing procedure on the at least one of the one of the one or more first internal files and the one of the one or more second internal files to identify one or more differences between the at least one of the one of the one or more first internal files and the one of the one or more second internal files, and storing data about the one or more differences in the output folder, and compressing data stored in the output folder into one output file.

In a further general aspect, the instant disclosure describes a non-transitory computer readable medium on which are stored instructions that when executed cause a programmable device to access a first application file and a second application file, the first application file being in a first language and the second application file being in a second language, the second application file having a same structure and providing a same function as the first application file, but the same function being provided in the second language by the second application file, access one or more first internal files for the first application file and one or more second internal files for the second application file, the one or more first internal files being one or more files that are included within a first software code associated with the first application file and the one or more second internal files being one or more files that are included within a second software code associated with the second application file, compare at least one of the one or more first internal files to one of the one or more second internal files to determine if the at least one of the one of the one or more first internal files is identical to the one of the one or more second internal files, upon determining that the at least one of the one of the one or more first internal files is not identical to the one of the one or more second internal files, perform at least one of copy both of the at least one of the one of the one or more first internal files and the one of the one or more second internal files to the output folder, or execute a differencing procedure on the at least one of the one of the one or more first internal files and the one of the one or more second internal files to identify one or more differences between the at least one of the one of the one or more first internal files and the one of the one or more second internal files, and storing data about the one or more differences in the output folder, and compress data stored in the output folder into one output file.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements. Furthermore, it should be understood that the drawings are not necessarily to scale.

DETAILED DESCRIPTION

Figure 1:
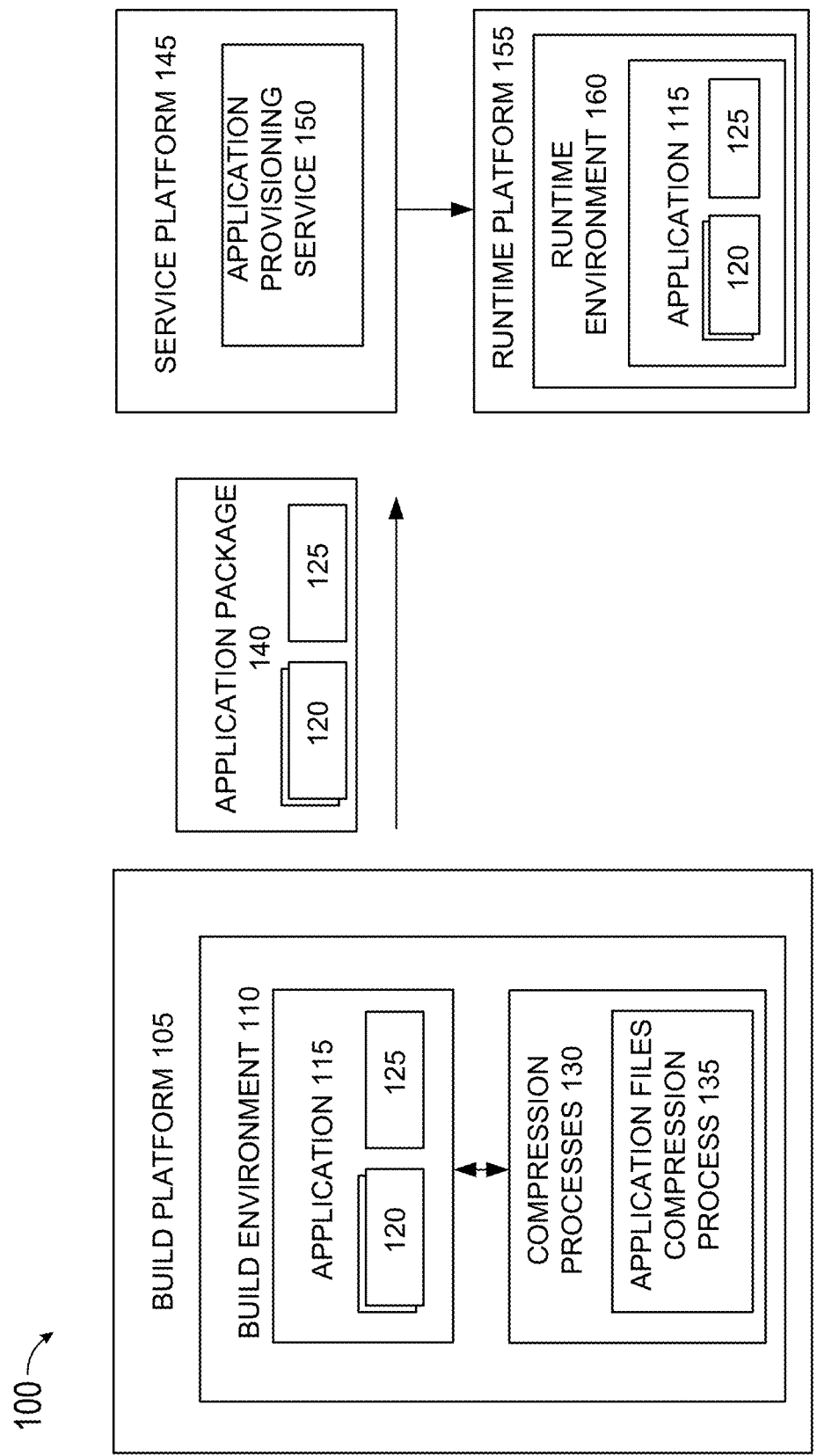
FIG. 1 depicts an example operational architecture upon which aspects of this disclosure may be implemented.

In the following detailed description, numerous specific details are set forth by way of examples in order to provide a thorough understanding of the relevant teachings. It will be apparent to persons of ordinary skill, upon reading this description, that various aspects can be practiced without such details. In other instances, well known methods, procedures, components, and/or circuitry have been described at a relatively high-level, without detail, in order to avoid unnecessarily obscuring aspects of the present teachings.

In today's computing environments, many software applications are localized in several different languages. For example, some Microsoft Office® applications are localized in more than 90 languages. Many software applications include various application files that help provide a variety of application functionalities. When different languages are used to localize a software application, the application files included in the software application may also need to be localized in the many different languages. Localization of application files may involve creating application files in different languages from an original template in one primary language (e.g., an English application file). Localization may include translation of text included in the application file and/or adjusting media content of the application files. For example, localization may include mirroring images for bidirectional languages.

Once the application files have been localized in all of the required languages, the resulting application may include numerous application files that take up a large amount of space. As an example, building block template files for a word processing application may have a size of about 319 MB, when offering the template files in 98 languages. Thus, when multiple languages are offered, application files for all the languages may take a significantly large amount of disk space. The required disc space may sometimes be even larger than the amount of space required for an application itself. The large amount of space required can lead to inefficient deployments, prohibitive memory space requirements, and in general increased footprint for an application. Thus, there exists a technical problem of large localized application files that result in increased bandwidth, memory and processor usage for use and storage of a software application.

Presently available processes for data compression are not tailored to compressing localized application files for software applications. As a result, none of the currently available data compression techniques offer highly efficient compression and decompression techniques for application files in different languages. As such, there exits another technical problem of lack of efficient compression techniques for reducing the size of localized application files.

To address these technical problems and more, in an example, this description provides a technical solution for an efficient method of compressing and decompressing localized software application files. To improve the current methods of data compression, the technical solution provides a compression technique specifically developed for use with application files that are localized in different languages to achieve a high compression ratio. The compression technique may make use of an application file in a primary language for comparison with application files in other languages. The technical solution may involve collecting an application file in a primary language and its localized counterparts, uncompressing the collected files to get access to their internal files, comparing binary files with the same name across all internal files, processing XML files with the same name across all application files, and compressing the resulting files into one file. When comparing the binary files, if the files are identical, only one copy may be kept. If the files are different, however, all the application files may be kept. When some files are identical, and others are not, only one file from the group of identical files may be kept. Processing the XML files may involve comparing the files to determine if they are identical and if so only one copy may be kept. When the files are different, an XML differencing algorithm may be used to compress the files. This results in significant size reduction for localized application files. Thus, the technical solution offers a very efficient mechanism for compressing localized software application files and as a result significant reduction in size of application files.

As will be understood by persons of skill in the art upon reading this disclosure, benefits and advantages provided by such technical solutions can include, but are not limited to, a solution to the technical problems of inefficient, resource-intensive storage and deployment of software applications. Technical solutions and implementations provided herein optimize and improve the process of compressing, storing and accessing localized software application files. The benefits provided by these technical solutions include providing increased efficiency in deployment and storage of software applications, and as such can result in improvements in computer devices which make use of software applications that utilize the technical solutions.

As used herein, "application" or "software application" may refer to any software program that provides computer functionalities to a computer user. Furthermore, as used herein, the term "electronic file" or "file" may be used to refer to any electronic file that can be created by a computing device and/or stored in a storage medium. The term "application file" may be used to refer to any file included or used with a software application and may include template files.

FIG. 1 illustrates an example operational architecture 100, upon which aspects of this disclosure may be implemented. The system 100 may include a build platform 105 on which a build environment 110 may be hosted. The build environment 110 may be utilized to build an application 115. Application 115 may include a variety of elements that together form a program or suite of programs, non-limiting examples of which are represented by one or more application files 120 and code 125. Various processes may be carried out in build environment 110 with respect to application 115 to produce an application package, such as compiling code, packaging binary code, running automated tests.

As part of building the application 115, build environment 110 may include compression processes 130, which may be applied to elements of application 115. In an example, the compression processes 130 may be applied to one or more of application files 120 and may include an application files compression process 135 to reduce the size of one or more localized application files, as is discussed in more detail below.

Once an application is developed, an application package 140, which may include the application files 120 and code 125 may be uploaded or otherwise provided to service platform 145. The application provisioning service 150 may then distribute the application package 140 in any of a variety of ways to runtime platforms for local execution. Runtime platform 155 is representative of one such local execution platform. For example, application package 140 may be downloaded to runtime platform 155 and installed as a local application 165 in a runtime environment 160. In another example, application package 140 may be streamed into runtime environment 160. Alternatively, the application package may be provisioned as a web application that executes in the context of a browser application's runtime environment. It should be noted that while shown separately, the build environment 110 may be integrated with the service platform 145 and/or application provisioning service 150. In the runtime environment 160, the contents of application files 120 may be decompressed and/or decoded at runtime, as application files are accessed by executing components of the code 125. In some implementations, the compression processes 130 includes compression techniques directed to compressing localized software application files.

Figure 2:
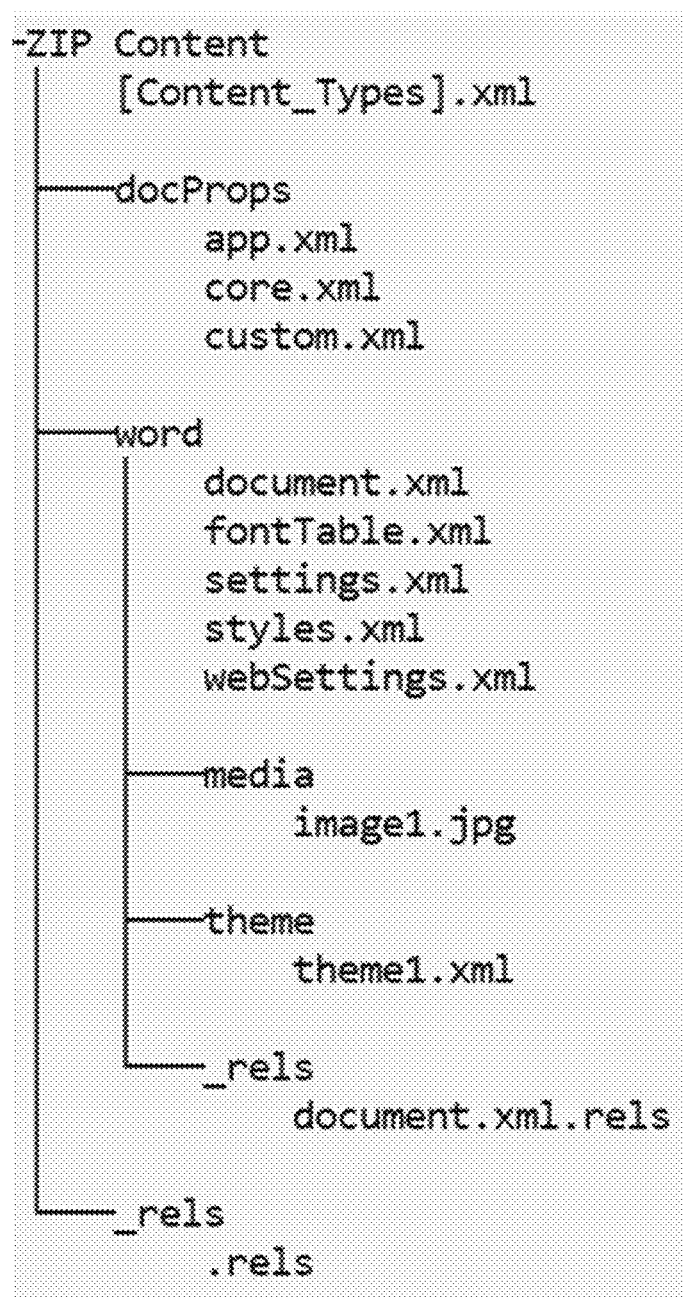
FIG. 2 depicts an example application file upon which aspects of this disclosure may be implemented.

An application file may include content such as text (e.g., alphanumeric content) and/or multimedia content. In some implementations, application files are formatted according to Office Open XML file format, which defines the structure and content of the application files. Office Open XML files are stored in open packaging conventions packages, such as ZIP files and contain XML and other data files. FIG. 2 depicts an example application file 200. The application file 200 may be a simple word processing document (e.g., Microsoft Word® document) that contains a few textual segments (e.g., words) and one image, and is formatted as a ZIP file. The ZIP file may contain several parts grouped into various folders. Most of these folders may contain XML data, while some include binary data. In some implementations, the XML data is structured in accordance with an Open XML schema that describes various aspects of the document. The binary data may include multimedia content such as the embedded picture image1.jpeg shown in the application file 200. Thus, the internal structure of the application file 200 includes several XML files (e.g., document.xml, fontTable.xml, theme1.xml) grouped into different folders, as well as one binary file (image1.jpg) grouped into a separate folder.

Application file 200 may depict the internal structure of an example primary language application file for which there are multiple localized counterparts (e.g., application file 200 in several other languages). While the counterpart application files may differ in that they include content in a different language than what is provided in the application file 200, the structure of the localized application files is the same or similar for most if not all languages. Furthermore, many localized application files are identical to their primary language application file, as the files do not contain anything that requires localization. While some application files may include some differences, the differences may be either translated text or formatting XML tags. As a result, an application file such as application file 200 often has significant overlapping content with its localized application files. This provides an opportunity for compressing the localized application files to achieve significant space savings. The technical solution provided herein utilizes a mechanism that combines the localized application files together and makes use of their similarities in several different ways to achieve a high compression ratio.

Figure 3:
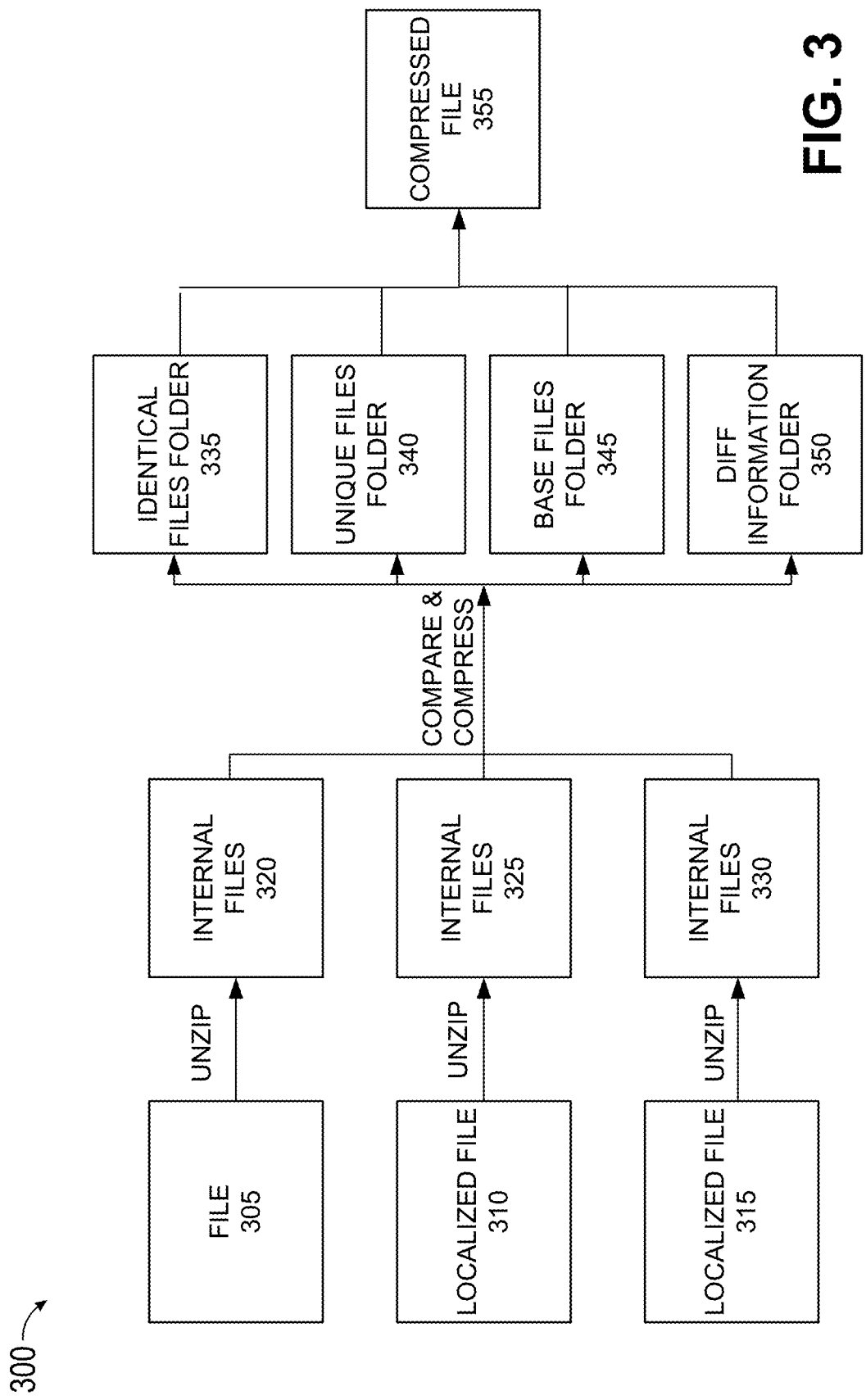
FIG. 3 is a data flow diagram depicting example application file transformations during a compression process.

FIG. 3 is a data flow diagram 300 depicting example application file transformations during a compression process. When a given application file in a primary language, such as file 305 is encountered, its localized counterparts such as localized files 310 and 315 may be identified and/or retrieved. The primary language may be any language selected by an administrator or the compression algorithm. In an example, the primary language may be English when the original application files are mostly in English and localized counterparts are in different languages. Some software applications (e.g., Microsoft® applications) are localized in many different languages (e.g., 27 to 98 languages). When many different counterpart files exist for an application file, all the localized application files may be identified and processed.

Once all localized counterpart application files are identified, each of the application files 305, 310 and 315 may be unzipped. That is because, as discussed above, many application files are stored in ZIP formats. The ZIP format is a binary format and files formatted in this manner are difficult to compress further. To achieve better compression, the ZIP files may be unzipped, and the internal files encoded. As such, file 305 may be unzipped to provide access to the internal files 320. Similarly, localized files 310 and 315 may be unzipped to reveal the internal files 325 and 330, respectively. For easier processing, the internal files may be unzipped into folders named after the application file's locale. For example, an English application file may be unzipped to a folder with "en-us" in its name. Each of the internal files 320, 325 and 330 may include XML and/or binary files.

Once the internal files become accessible, they may be compared and processed to determine which ones can be removed and/or compressed. This may involve comparing the binary files with the same name across all application files (e.g., across files 305, 310 and 315). When identical binary files are identified between the primary and localized files, one of the identical files may be kept and stored in an identical files folder 335. For example, the primary language copy of the identical files may be kept. When the binary files are determined to be different, all the different files may be kept and stored in a unique files folder 340. In some implementations, the unique files folder 340 includes multiple folders, for example, one folder for files that are unique to each language (e.g., en-us, sp-sp, etc.). When some of the binary files with the same name are identical while others are not, one copy of the identical files may be kept and stored in the identical files folder 335. The different files may then be stored in the unique files folder 340.

The practice of comparing and processing the internal files may also include comparing XML internal files with the same name and path across all application files (e.g., across files 305, 310 and 315). When identical XML internal files are identified, one of the identical may be stored in the identical files folder 335. If the XML files are different, however, a differencing mechanism may be utilized to identify the differences. The differencing mechanism may result in a base XML file, as well as a file containing data about the differences. The base XML file may be stored in a base files folder 345, while the file containing data about the differences is stored in a diff information folder 350. In some implementations, the data about the differences is stored in text files. The text files may have the extension .diff for easy reference.

The files in the one or more of the folders 335, 340, 345 and 350 may be compressed into a compressed file 355 to provide a final compressed file for the primary language 305 and its localized counterparts 310 and 315. The compression may be achieved using conventional compression techniques as such ZIP compression or 7Z compression. By combining an application file in a primary language and its counterpart localized application files into one file, a higher compression ratio may be achieved. That is because ZIP compression requires additional space for every file name even if the file is a blank one. Combining the decompression data for all the files into a single output file reduces this additional required space, thus resulting in additional space savings.

Figure 4:
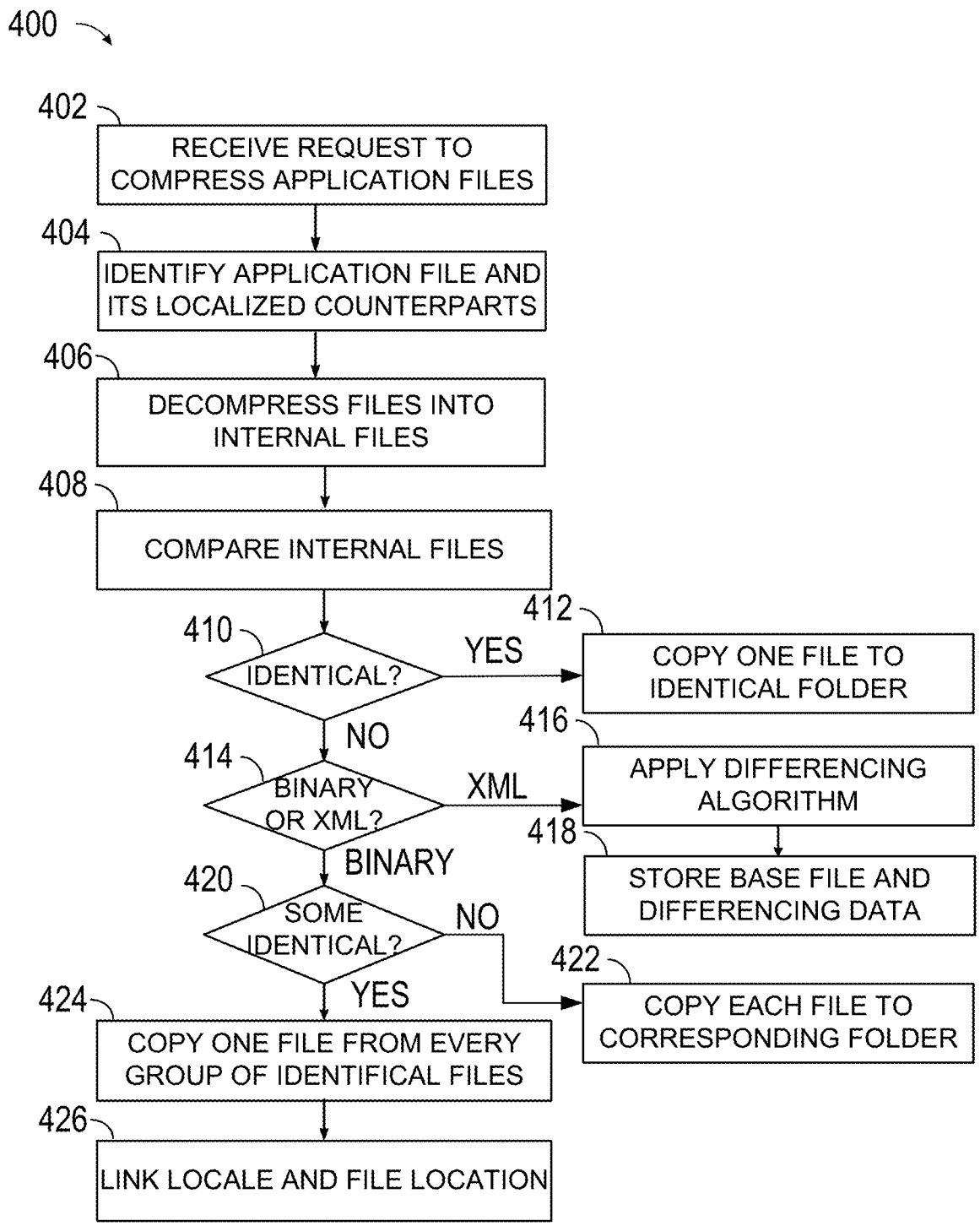
FIG. 4 is a flow diagram depicting an example method for compressing application files and their corresponding localized counterparts.

FIG. 4 is a flow diagram depicting an example method 400 for compressing application files and their corresponding localized counterparts. In some implementations, at least some of the steps of method 400 may be performed by one or more elements of an application build platform, such as the application build platform 105 of FIG. 1. At 402, method 400 may begin by receiving a request to compress application files included in an application (e.g., an application package). The request may be received as part of the application build process from one or more elements of the build environment. Once a request is received, method 400 may proceed to identify application files having corresponding localized counterparts, at 404. This may involve examining the application files included in an application package to identify application files and determine which ones have been localized in different languages.

Once an application file that has been localized in more than one language is identified, the identified files may be decompressed into their internal files, at 406. This may involve unzipping each application file to provide access to the underlying internal files (e.g., binary and XML files). After the internal files become accessible, method 400 may proceed to compare the internal files with the same name across all identified locales (e.g., all languages in which an application file exists). In some implementation, the process includes designating one of the application files as a primary language application file (e.g., English US) and comparing the files having the same name in different locales with the primary language file. For example, the files fr-fr\word\media\image1.jpg and es-es\word\media\image1.jpg may be compared to en-us\word\media\image1.jpg.

Once the files are compared, method 400 may proceed to determine if the files are identical in all languages, at 410. When it is determined that the files are identical in all languages (yes at 410), method 400 may proceed to copy one of the identical files to an identical file folder, at 412. In some implementations, the identical file folder is referred to as the shared folder. When copying one of the identical files to the identical file folder, the file name and relative path of the file may be kept unchanged. For example, en-us\word\media\image1.jpg may be moved to shared\word \media\image1.jpg.

When it is determined that one or more of the files are not identical (no at step 410), method 400 may proceed to determine if the files having the same name are binary or XML files, at 414. If it is determined that the files are XML files, method 400 may proceed to apply a differencing algorithm, at 416, as further discussed below. After the differencing algorithm is applied, method 400 may store a base file and differencing data in appropriate folders, at 418.

Once it is determined, at 414, that the files being compared are binary files, method 400 may proceed to determine if at least some of the files are identical, at 420. That is because, even when all of the files are not identical, binary files may be identical in some languages. If it is determined that none of the files are identical (no at step 420), then method 400 may proceed to copy each file to a corresponding locale folder, at 422. For example, if the files being compared are en\file.ext, sp\file.ext and fr\file.ext, and it is determined that they are not identical, en\file.ext may be copied to an en folder, sp\file.ext may be copied to a sp folder and fr\file.ext may be copied to an fr folder.

When it is determined that the files are identical in some languages (yes at step 420), one file from every group of identical files may be copied, at 424. Method 400 may then proceed to link locale and file information in a locale diff file, at 426. The process of copying a file and linking locale and file information may include adding an extension to the name (adding extension number) and saving the file to a Diff folder. For every language in the group of identical files, the new file extension may be written to the diff file in the following format:
\txx-yy
L\tN
The designation "\t" in the specified format is a tab (\u0009), which is a common delimiter in the diff format. The designation "xx-yy" may be the locale. For example, it may be us-en or sp-sp. The "L" is a designation for identifying the action of linking. The number "N" is the added extension associated with the Nth group of identical files (e.g., 1 for the first group). For example, if Spanish and English have identical word\foo.jpg files, but other languages do not, then the file diff\word\foo.jpg.diff should contain the following data:
\ten-us
L\t1
\tes-es
L\t1
The process of copying one file to the Diff folder and writing the diff data to the diff file for all groups of identical files may be repeated and the added extension may be incremented for each group of identical files.

When a binary file is missing in a language and exists in other languages, the following information may be written to the corresponding diff file:
\txx-yy
M
The letter "M" indicates that the file is missing. This indicates that the file is not necessary in this locale.

Steps 408 to 426 of method 400 may be repeated for all internal files having the same name. Once all internal files having the same name having been processed, the resulting compressed files, which may be stored in different folders may be compressed into a single file for the application file. This may result in one final compressed application file that contains information for the primary language as well as all other localized languages. This results in reduced file sizes and helps the technical solution achieve an even higher compression ratio.

As discussed above, when the internal files are XML files and they are determined as not being identical when they are compared, a differencing algorithm may be used to identify the differences between the XML files. That is because XML content of a localized application file often has the same structure in all languages. The XL files may be different because they include translated text and/or one or more added tags that are needed only in some languages (e.g., a property that indicates a right-to-left paragraph in Arabic), but the majority of the XML content may be the same. The differencing algorithm may use data differencing to separate identical and distinct parts of the XML files. The differencing algorithm may be an XML differencing algorithm that utilizes a base file to restore all other files. This may involve selecting a file in one of the languages a base file (e.g., primary language file) and storing the differences between the base file and the remaining files.

In some implementations, the differencing algorithm creates a diff file which includes instructions on the actions that should be taken to restore one XML file from another. The types of actions available may be replace, delete, add, and exchange attributes. The delete action may not require additional content, while replace, add and exchange actions may need some content for replacing, adding or exchanging. The required content for the delete action may be stored in a list of strings. The order of operation may be the same at decompression and elements of the list of strings may not require linkage to the corresponding action lists. The elements may be retrieved in the order in which they are stored in.

In some implementations, the XML differencing algorithm begins by reading two XML files that need to be compared (e.g., a base file and a localized file). In reading the XML Files, every XML element and text may be kept as separate lines, while formatting, spaces and tabulation is removed. An example given input XML is provided below:
<book category="web">
    <title lang="en">Learning XML</title>
    <author>Erik T. Ray</author>
</book>
The above input XML may be converted to the below XML output:
<book category="web">
<title lang="en">
Learning XML
</title>
<author>
Erik T. Ray
</author>
</book>
Once the XML lines are converted, each line of the base XML file may be compared with a corresponding line from the localized XML file. When two lines being compared are identical in both XML files, the process may advance to the next line. That is because there are no differences between the lines and as such no diff data is necessary. When the lines are different by content of attributes, then the base file's line number may be stored in the list of exchange commands. Moreover, the localized file's attribute content may be stored in the list of strings. This may be done for each attribute separately. All content may be stored, even if some of them are identical in both files. For example, for the lines <title lang="en">and <title lang="sp">, the line number 1 may be stored in the list of exchange commands, while the attribute content "sp" is stored in the list of strings.

When the two lines being compared are different, but the next lines are identical, differencing may be achieved by storing the base file's line number in a replace list and storing the entire next line of the localized file in the list of strings. When two lines are simply different, lines that should be removed or added to the localized XML file are collected until the next identical or exchangeable lines are encountered. Furthermore, if there are lines that need to be deleted in the base file to match the localized file, the line number of the base file may be added to the delete list. If there are lines to add to the base file to match the localized file, then for every added line, the current base file line number may be added to the add list, content of the localized file's line may be added to the list of strings, and the base file's line number may not be incremented. The additions and deletions may be processed in the order that a Longest Common Subsequence algorithm suggests.

Once all the lines are compared, the collected data may be converted to a format suitable for storage (e.g. a text format). For the add list, this may involve writing A, a tab and then the required numbers in the list delimited by a tab. For example, an add list may be written as A\t5\t7\t100. A similar procedure may be performed for each of the delete, replace and exchange lists with letters D, R, and E, respectively. For the list of strings, the letter T may be written as a separate line, and then each string may be stored as separate lines. For example, the following may be written for a given string list:

T en

Learning XML

This information may be written to a corresponding diff file, while the diff file is prefixed with the line that indicates a locale section. For example, \txx-yy\tlength may be used, where is a tab, xx-yy is the localized file's locale, and length is the length of the list of strings. In some implementations, the length is optional and helps to travers inside the diff file. For example, a diff file with one replacement action and one exchange action may contain the following content:

\ten-us\2

R\t2

E\t1

T en

Learning XML

The process of comparing lines of texts may result in finding mismatching subsequences. That is because comparing two similar sets of text lines often eventually comes across subsequences that are different. The comparison algorithm can identify simple cases of dissimilarity (e.g., one different line or one line that is different by attribute contents). If more than one line in a sequence is different, then a subsequence of different lines may be isolated and processed. The differencing algorithm can then continue starting from the next identical lines.

However, isolating and processing a subsequence of different lines is often a challenging and memory intensive process, as it may require processing many possible combinations of differencing. To increase efficiency, in some implementations, an improved version of the conventional Longest Common Subsequence algorithm may be utilized. The conventional algorithm creates a matrix of common subsequence lengths and then traverses the matrix backward to find a path with the longest common subsequence. The improved Longest Common Subsequence algorithm may accelerate the process and may not need the path for the entire file.

Instead of processing an entire file, the improved algorithm may only process a portion of the next lines in compared files. For example, the algorithm may process the next 30 lines. The algorithm may start with a given number of lines (e.g., 30 lines) and increase the number of lines if no matching lines are found. If the algorithm cannot find matching lines after it increases the matrix size five times, it assumes the files are too different to use the differencing mechanism. The entire localized file may then be stored as a unique file instead of a diff file. If, a matching line is identified when comparing the lines, the algorithm stops. Thus, while conventional algorithms continue until the entire path is found, the improved algorithm described herein stops on the first matching element. In an example, the real comparison entities of the improved algorithm may be hash values of lines. For example, every line gets a hash value calculated from the line's content. To achieve this any string hashing function may be employed. The input may be the next portion of lines (e.g., the next 30 lines) from both files. In some implementations, the input is size is selected such that is not too short to avoid miscalculating the best path. Thus, an improved differencing algorithm may be utilized to identify the differences between the internal XML files.

Figure 5:
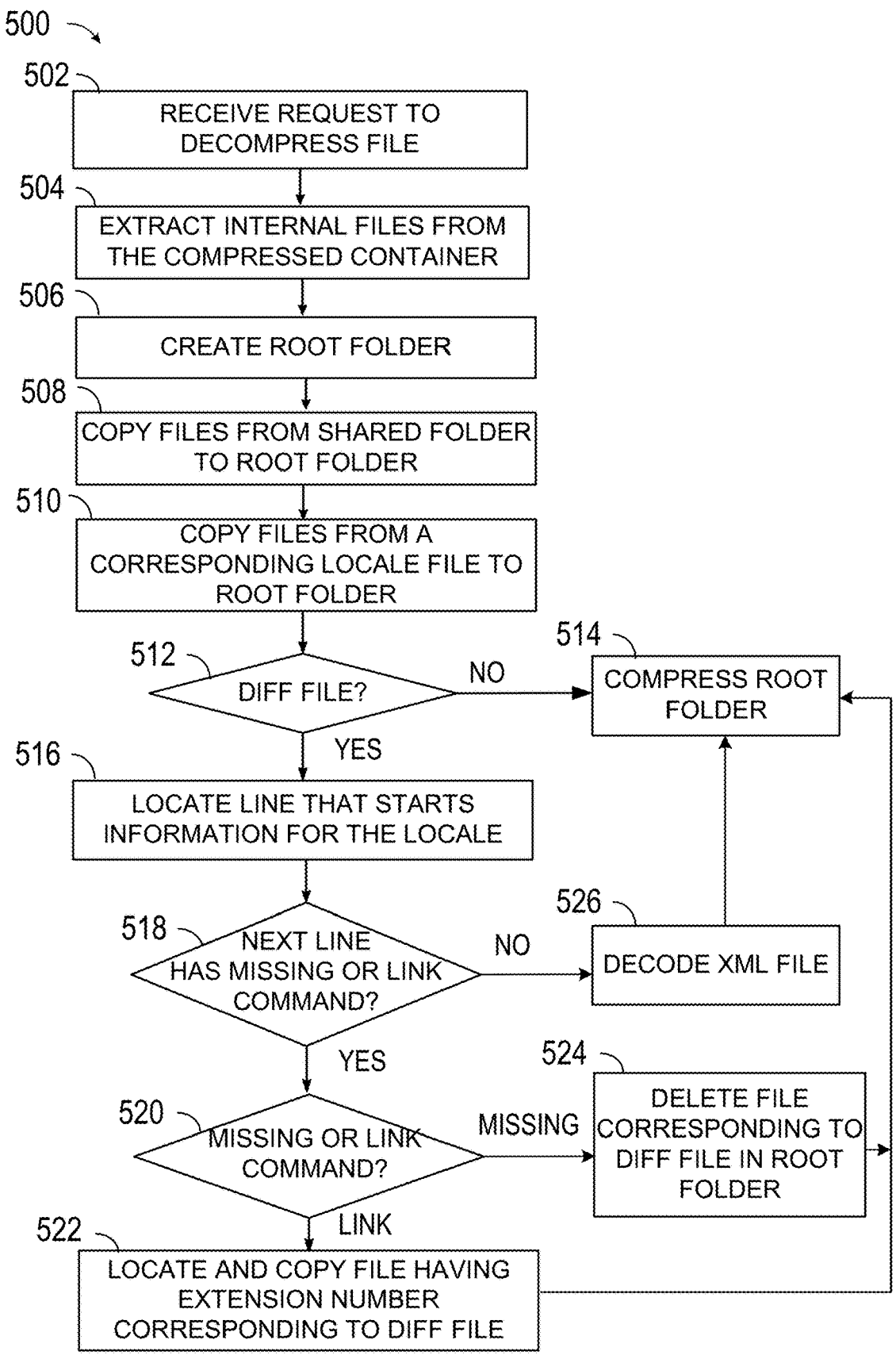
FIG. 5 is a flow diagram depicting an example method for decompressing application files in one or more languages.

FIG. 5 is a flow diagram depicting an example method 500 for decompressing application files that are in one or more languages. The steps of method 500 may be performed by the software application which includes the application file and may be executed by the client device or server executing the software application. At 502, method 500 may begin by receiving a request to decompress a given application file. This may be for a primary language application file and/or a localized application file.

After receiving the request, method 500 may proceed to extract the internal files from the compressed container that contains the compressed application file, at 504. The container may be compressed with ZIP or another compression mechanism. Depending on the compression mechanism used to compress the application file, a corresponding extraction mechanism may be used for extracting the internal files. In some implementations, the extracted content contains at least a Shared folder, a Diff folder and one or more locale folders. Decompressing the application file may involve recreating the application file from the internal files located in the extracted folders.

To being the decompression process, method 500 may proceed to create a root folder for the application file structure, at 506. The root folder may be an empty folder named root. Once the root folder is created and the internal files have been extracted, the files from the shared folder may be copied to the root folder, at 508. Copying may be performed such that any subfolder tree structure remains unchanged. Next, method 500 may copy the files from a locale folder that corresponds to the application file being decompressed to the root, at 510. For example, if the application file being compressed is for the sp-sp locale, the files from the sp-sp folder of the extracted files are copied to the root folder.

Once the files from the shared folder and the correct locale folder are copied, method 500 may proceed to determine if there are any unprocessed diff files in the Diff folder, at 512. When it is determined that there is an unprocessed diff file in the Diff folder (yes at step 512), method 500 may read the lines from the diff file to locate a line in the diff file that starts the information for the locale corresponding to the application file being decompressed, at 516. For example, for the en-us locale, method 500 may search for the line of code in the diff file that starts the information for the en-us locale. In an example, that line may read \ten-us\2. Once the line has been located, method 500 may proceed to read the next line in the file to determine if the line contains a missing command (e.g., the letter M) or a link command (e.g., the letter L, tab and a number), at 518.

When it is determined that the next line in the file contains a missing or link command, method 500 may proceed to determine which ones of the missing or link commands are included in the line, at 520. If the line contains a missing command, method 500 may proceed to delete the file corresponding to the diff file in the root folder, at 524. The corresponding file may be a file with the same name and relative path as the diff file, but without the .diff extension. When it is determined that the line contains a link command, method 500 may proceed to locate the file with the extension number corresponding to the diff file in the Shared folder and copy the located file to a location under the root folder, at 522. For example, if the diff file is media\image.jpg.diff and it contains the line "L\t1", then the corresponding file is media\image.jpg.1. If the located file has a subfolder (e.g., "media\"), then the subfolder with the same name may be created in the root folder and the file may be copied to the newly created subfolder. The additional extensions (e.g., 0.1) may be removed when the file is copied to the subfolder. For example, media\image.jpg.1 is copied to root\media\image.ipg.

When it is determined, at step 518, that the next line does not contain a missing or link command, then the corresponding file is an XML file and the diff lines contain data for decoding the XML file. As a result, method 500 may proceed to decode the XML file, at 526. An XML file may be decoded according to the same structure as the XML differencing mechanism used to create the diff files. The Diff folder of a compressed package may contain base XML files and diff files. The diff files include instructions for transforming the base XML into a file in a particular language. As discussed above, there are four groups of instructions—Delete, Add, Replace, Exchange. The instructions are listed in the diff files as separate lines with a letter (D, A, R, E) and tab-delimited numbers. The numbers are line numbers of the base XML file. In some implementations, there is also a text section in a diff file. The text section may start with the letter T on a separate line. The lines that follow may contain text entities. The instructions may define where to change the base XML and the text entities may include the content to inject or replace in the base XML. As a result, to decode an XML file, first the correct locale section in the corresponding diff file (e.g., the line \ten-us\2 for English (U.S.)) may be located. Next, the instructions and text lines up to the next locale section may be loaded. Then, the base XML file may be loaded and preprocessed as discussed above according to the XML differencing mechanism used. The preprocessing may split the XML file into lines that can be decoded.

Once the lines are preprocessed and are ready for processing, the XML lines may be processed one by one, while a line counter is incremented for every processed line. If the line number is not in any of the instructions (e.g., Delete, Add, Replace, or Exchange), then the line may be copied to the line to an output XML. If the line number is in a Delete instructions list, then the line is not copied. If the line number is in a Replace instructions list, then the next text entity from the text section may be copied to the output XML. When the line number is in an Add instructions list, then the line from the base XML may be copied and the next line from the text section may be added. The Add instructions may contain the same line number multiple times. When that occurs, entities from the text section may be added for every occurrence of the line number.

When the line number is in an Exchange instructions list, then the base line has XML attributes which may need to be replaced. To achieve this, substrings enclosed in double quote marks in the base line may be located. When the substrings are located, the enclosed content may be replaced with entities from the text section. For example, if the base line is <a b="One" c="Two"> and the text section's current lines are Uno and Dos, then the output may be <a b="Uno" c="Dos">. The lines of the base XML file may be processed in this manner until all lines are processed. This completes the XML decoding of the XML file.

When the XML file has been decoded, method 500 may proceed to compress the files in the root folder, at 514. Compressing the root folder may involve utilizing a known compression mechanism. For example, ZIP compression may be used to convert the files in the root folder to one ZIP file that can be consumed as a single file. Compressing the files in the root folder may also occur, if it is determined, at step 512 that there are no unprocessed diff files (no at step 512). Furthermore, compressing the root folder files may occur after the missing command or link command has been processed (after steps 522 and 524). In this manner, decompressing the compressed file involves distributing files from a compacted archive to their original folders in a manner that recreates the original folders and files. Thus, binary files are copied and XML files are decoded and positioned in folders that correspond with the original folders.

Thus, in different implementations, a technical solution is provided for an improved method and system of compressing and decompressing application files having counterpart localized files. The technical solution provides a compression mechanism for compressing the application files by eliminating multiple identical internal files and/or processing the differences between different files to create one final application file that contains information for all of the available localized application files. Thus, the technical solution provides a highly efficient mechanism for compressing, storing, and decompressing application files that are provided in multiple languages. In an example, the technical solution provides a compression ratio of 800:1.

Figure 6:
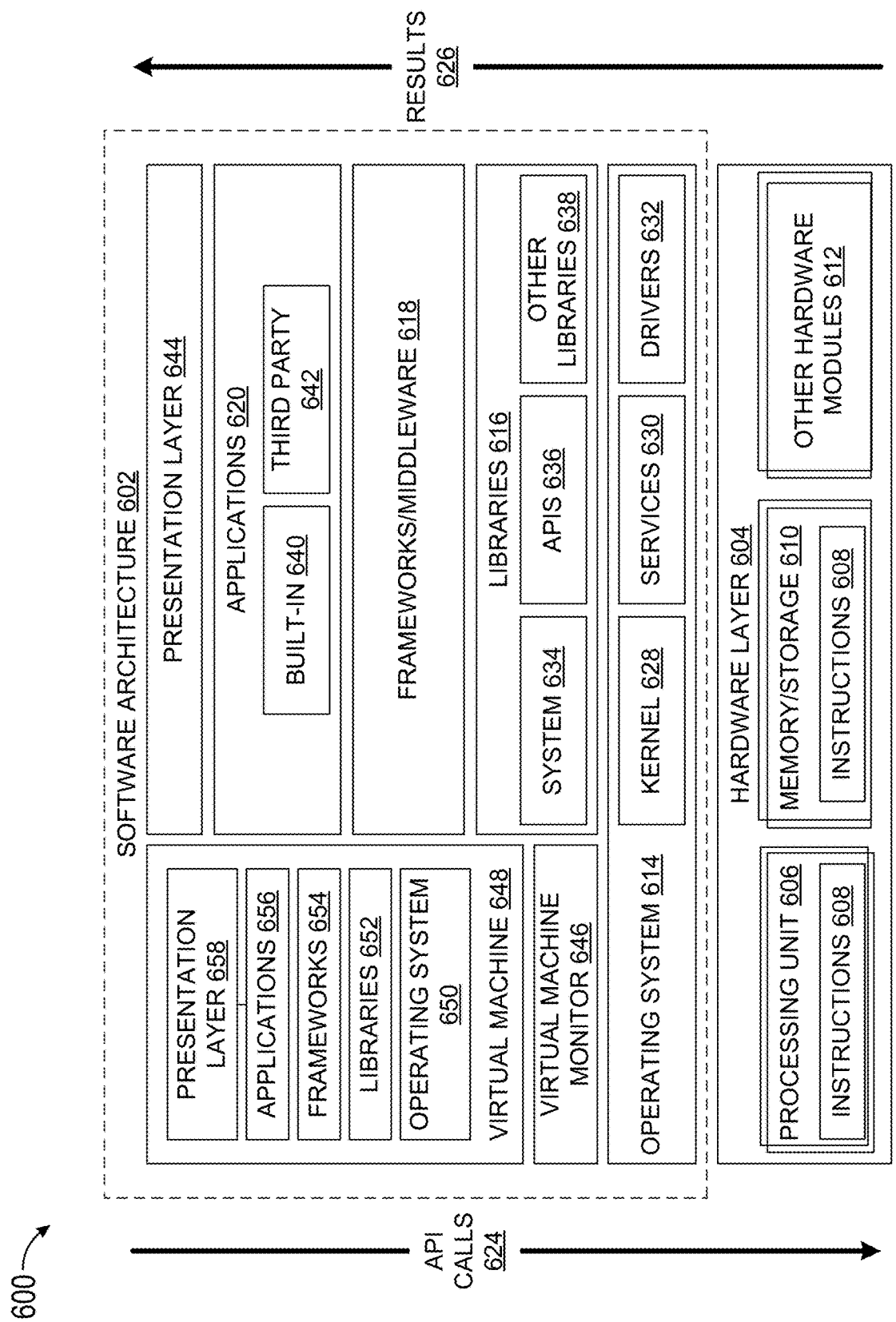
FIG. 6 is a block diagram illustrating an example software architecture, various portions of which may be used in conjunction with various hardware architectures herein described.

FIG. 6 is a block diagram 600 illustrating an example software architecture 602, various portions of which may be used in conjunction with various hardware architectures herein described, which may implement any of the above-described features. FIG. 6 is a non-limiting example of a software architecture and it will be appreciated that many other architectures may be implemented to facilitate the functionality described herein. The software architecture 602 may execute on hardware such as client devices, native application provider, web servers, server clusters, external services, and other servers. A representative hardware layer 604 includes a processing unit 606 and associated executable instructions 608. The executable instructions 608 represent executable instructions of the software architecture 602, including implementation of the methods, modules and so forth described herein.

The hardware layer 604 also includes a memory/storage 610, which also includes the executable instructions 608 and accompanying data. The hardware layer 604 may also include other hardware modules 612. Instructions 608 held by processing unit 608 may be portions of instructions 608 held by the memory/storage 610.

The example software architecture 602 may be conceptualized as layers, each providing various functionality. For example, the software architecture 602 may include layers and components such as an operating system (OS) 614, libraries 616, frameworks 618, applications 620, and a presentation layer 644. Operationally, the applications 620 and/or other components within the layers may invoke API calls 624 to other layers and receive corresponding results 626. The layers illustrated are representative in nature and other software architectures may include additional or different layers. For example, some mobile or special purpose operating systems may not provide the frameworks/middleware 618.

The OS 614 may manage hardware resources and provide common services. The OS 614 may include, for example, a kernel 628, services 630, and drivers 632. The kernel 628 may act as an abstraction layer between the hardware layer 604 and other software layers. For example, the kernel 628 may be responsible for memory management, processor management (for example, scheduling), component management, networking, security settings, and so on. The services 630 may provide other common services for the other software layers. The drivers 632 may be responsible for controlling or interfacing with the underlying hardware layer 604. For instance, the drivers 632 may include display drivers, camera drivers, memory/storage drivers, peripheral device drivers (for example, via Universal Serial Bus (USB)), network and/or wireless communication drivers, audio drivers, and so forth depending on the hardware and/or software configuration.

The libraries 616 may provide a common infrastructure that may be used by the applications 620 and/or other components and/or layers. The libraries 616 typically provide functionality for use by other software modules to perform tasks, rather than rather than interacting directly with the OS 614. The libraries 616 may include system libraries 634 (for example, C standard library) that may provide functions such as memory allocation, string manipulation, file operations. In addition, the libraries 616 may include API libraries 636 such as media libraries (for example, supporting presentation and manipulation of image, sound, and/or video data formats), graphics libraries (for example, an OpenGL library for rendering 2D and 3D graphics on a display), database libraries (for example, SQLite or other relational database functions), and web libraries (for example, WebKit that may provide web browsing functionality). The libraries 616 may also include a wide variety of other libraries 638 to provide many functions for applications 620 and other software modules.

The frameworks 618 (also sometimes referred to as middleware) provide a higher-level common infrastructure that may be used by the applications 620 and/or other software modules. For example, the frameworks 618 may provide various graphic user interface (GUI) functions, high-level resource management, or high-level location services. The frameworks 618 may provide a broad spectrum of other APIs for applications 620 and/or other software modules.

The applications 620 include built-in applications 640 and/or third-party applications 642. Examples of built-in applications 640 may include, but are not limited to, a contacts application, a browser application, a location application, a media application, a messaging application, and/or a game application. Third-party applications 642 may include any applications developed by an entity other than the vendor of the particular system. The applications 620 may use functions available via OS 614, libraries 616, frameworks 618, and presentation layer 624 to create user interfaces to interact with users.

Some software architectures use virtual machines, as illustrated by a virtual machine 628. The virtual machine 628 provides an execution environment where applications/modules can execute as if they were executing on a hardware machine (such as the machine 600 of FIG. 6, for example). The virtual machine 628 may be hosted by a host OS (for example, OS 614) or hypervisor, and may have a virtual machine monitor 646 which manages operation of the virtual machine 628 and interoperation with the host operating system. A software architecture, which may be different from software architecture 602 outside of the virtual machine, executes within the virtual machine 648 such as an OS 650, libraries 652, frameworks 654, applications 656, and/or a presentation layer 658.

Figure 7:
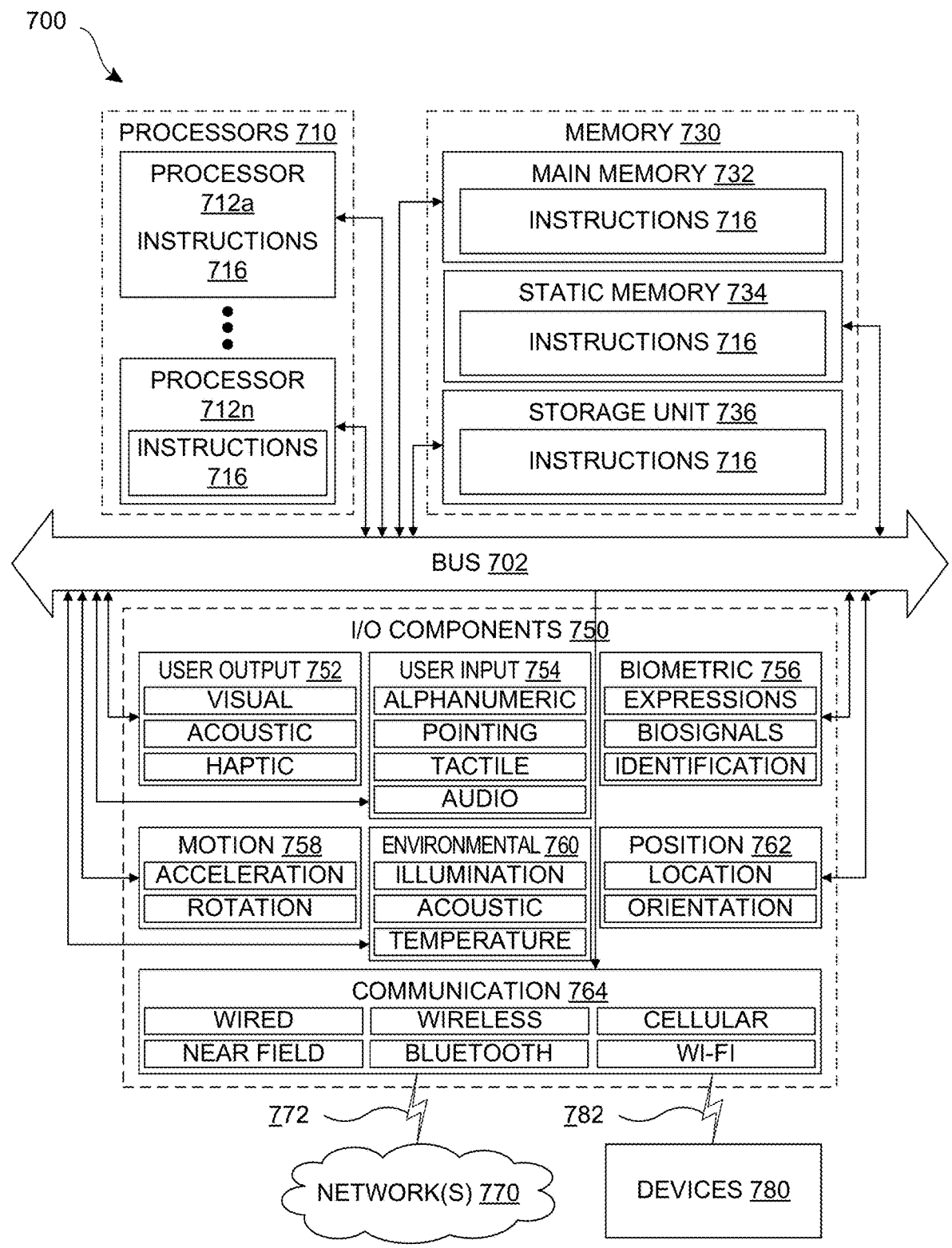
FIG. 7 is a block diagram illustrating components of an example machine configured to read instructions from a machine-readable medium and perform any of the features described herein.

FIG. 7 is a block diagram illustrating components of an example machine 700 configured to read instructions from a machine-readable medium (for example, a machine-readable storage medium) and perform any of the features described herein. The example machine 700 is in a form of a computer system, within which instructions 716 (for example, in the form of software components) for causing the machine 700 to perform any of the features described herein may be executed. As such, the instructions 716 may be used to implement methods or components described herein. The instructions 716 cause unprogrammed and/or unconfigured machine 700 to operate as a particular machine configured to carry out the described features. The machine 700 may be configured to operate as a standalone device or may be coupled (for example, networked) to other machines. In a networked deployment, the machine 700 may operate in the capacity of a server machine or a client machine in a server-client network environment, or as a node in a peer-to-peer or distributed network environment. Machine 700 may be embodied as, for example, a server computer, a client computer, a personal computer (PC), a tablet computer, a laptop computer, a netbook, a set-top box (STB), a gaming and/or entertainment system, a smart phone, a mobile device, a wearable device (for example, a smart watch), and an Internet of Things (IoT) device. Further, although only a single machine 700 is illustrated, the term "machine" includes a collection of machines that individually or jointly execute the instructions 716.

The machine 700 may include processors 710, memory 730, and I/O components 750, which may be communicatively coupled via, for example, a bus 702. The bus 702 may include multiple buses coupling various elements of machine 700 via various bus technologies and protocols. In an example, the processors 710 (including, for example, a central processing unit (CPU), a graphics processing unit (GPU), a digital signal processor (DSP), an ASIC, or a suitable combination thereof) may include one or more processors 712a to 712n that may execute the instructions 716 and process data. In some examples, one or more processors 710 may execute instructions provided or identified by one or more other processors 710. The term "processor" includes a multi-core processor including cores that may execute instructions contemporaneously. Although FIG. 7 shows multiple processors, the machine 700 may include a single processor with a single core, a single processor with multiple cores (for example, a multi-core processor), multiple processors each with a single core, multiple processors each with multiple cores, or any combination thereof. In some examples, the machine 700 may include multiple processors distributed among multiple machines.

The memory/storage 730 may include a main memory 732, a static memory 734, or other memory, and a storage unit 736, both accessible to the processors 710 such as via the bus 702. The storage unit 736 and memory 732, 734 store instructions 716 embodying any one or more of the functions described herein. The memory/storage 730 may also store temporary, intermediate, and/or long-term data for processors 710. The instructions 716 may also reside, completely or partially, within the memory 732, 734, within the storage unit 736, within at least one of the processors 710 (for example, within a command buffer or cache memory), within memory at least one of I/O components 750, or any suitable combination thereof, during execution thereof. Accordingly, the memory 732, 734, the storage unit 736, memory in processors 710, and memory in I/O components 750 are examples of machine-readable media.

As used herein, "machine-readable medium" refers to a device able to temporarily or permanently store instructions and data that cause machine 700 to operate in a specific fashion. The term "machine-readable medium," as used herein, does not encompass transitory electrical or electromagnetic signals per se (such as on a carrier wave propagating through a medium); the term "machine-readable medium" may therefore be considered tangible and non-transitory. Non-limiting examples of a non-transitory, tangible machine-readable medium may include, but are not limited to, nonvolatile memory (such as flash memory or read-only memory (ROM)), volatile memory (such as a static random-access memory (RAM) or a dynamic RAM), buffer memory, cache memory, optical storage media, magnetic storage media and devices, network-accessible or cloud storage, other types of storage, and/or any suitable combination thereof. The term "machine-readable medium" applies to a single medium, or combination of multiple media, used to store instructions (for example, instructions 716) for execution by a machine 700 such that the instructions, when executed by one or more processors 710 of the machine 700, cause the machine 700 to perform and one or more of the features described herein. Accordingly, a "machine-readable medium" may refer to a single storage device, as well as "cloud-based" storage systems or storage networks that include multiple storage apparatus or devices.

The I/O components 750 may include a wide variety of hardware components adapted to receive input, provide output, produce output, transmit information, exchange information, capture measurements, and so on. The specific I/O components 750 included in a particular machine will depend on the type and/or function of the machine. For example, mobile devices such as mobile phones may include a touch input device, whereas a headless server or IoT device may not include such a touch input device. The particular examples of I/O components illustrated in FIG. 7 are in no way limiting, and other types of components may be included in machine 700. The grouping of I/O components 750 are merely for simplifying this discussion, and the grouping is in no way limiting. In various examples, the I/O components 750 may include user output components 752 and user input components 754. User output components 752 may include, for example, display components for displaying information (for example, a liquid crystal display (LCD) or a projector), acoustic components (for example, speakers), haptic components (for example, a vibratory motor or force-feedback device), and/or other signal generators. User input components 754 may include, for example, alphanumeric input components (for example, a keyboard or a touch screen), pointing components (for example, a mouse device, a touchpad, or another pointing instrument), and/or tactile input components (for example, a physical button or a touch screen that provides location and/or force of touches or touch gestures) configured for receiving various user inputs, such as user commands and/or selections.

In some examples, the I/O components 750 may include biometric components 756, motion components 758, environmental components 760 and/or position components 762, among a wide array of other environmental sensor components. The biometric components 756 may include, for example, components to detect body expressions (for example, facial expressions, vocal expressions, hand or body gestures, or eye tracking), measure biosignals (for example, heart rate or brain waves), and identify a person (for example, via voice-, retina-, and/or facial-based identification). The position components 762 may include, for example, location sensors (for example, a Global Position System (GPS) receiver), altitude sensors (for example, an air pressure sensor from which altitude may be derived), and/or orientation sensors (for example, magnetometers). The motion components 758 may include, for example, motion sensors such as acceleration and rotation sensors. The environmental components 760 may include, for example, illumination sensors, acoustic sensors and/or temperature sensors.

The I/O components 750 may include communication components 764, implementing a wide variety of technologies operable to couple the machine 700 to network(s) 770 and/or device(s) 780 via respective communicative couplings 772 and 782. The communication components 764 may include one or more network interface components or other suitable devices to interface with the network(s) 770. The communication components 764 may include, for example, components adapted to provide wired communication, wireless communication, cellular communication, Near Field Communication (NFC), Bluetooth communication, Wi-Fi, and/or communication via other modalities. The device(s) 780 may include other machines or various peripheral devices (for example, coupled via USB).

In some examples, the communication components 764 may detect identifiers or include components adapted to detect identifiers. For example, the communication components 664 may include Radio Frequency Identification (RFID) tag readers, NFC detectors, optical sensors (for example, one- or multi-dimensional bar codes, or other optical codes), and/or acoustic detectors (for example, microphones to identify tagged audio signals). In some examples, location information may be determined based on information from the communication components 762, such as, but not limited to, geo-location via Internet Protocol (IP) address, location via Wi-Fi, cellular, NFC, Bluetooth, or other wireless station identification and/or signal triangulation.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

Generally, functions described herein (for example, the features illustrated in FIGS. 1-7) can be implemented using software, firmware, hardware (for example, fixed logic, finite state machines, and/or other circuits), or a combination of these implementations. In the case of a software implementation, program code performs specified tasks when executed on a processor (for example, a CPU or CPUs). The program code can be stored in one or more machine-readable memory devices. The features of the techniques described herein are system-independent, meaning that the techniques may be implemented on a variety of computing systems having a variety of processors. For example, implementations may include an entity (for example, software) that causes hardware to perform operations, e.g., processors functional blocks, and so on. For example, a hardware device may include a machine-readable medium that may be configured to maintain instructions that cause the hardware device, including an operating system executed thereon and associated hardware, to perform operations. Thus, the instructions may function to configure an operating system and associated hardware to perform the operations and thereby configure or otherwise adapt a hardware device to perform functions described above. The instructions may be provided by the machine-readable medium through a variety of different configurations to hardware elements that execute the instructions.

In the following, further features, characteristics and advantages of the invention will be described by means of items:

Item 1. A data processing system comprising:
a processor; and
a memory in communication with the processor, the memory comprising executable instructions that, when executed by the processor, cause the data processing system to perform functions of:
  accessing a first application file and a second application file, the first application file being in a first language and the second application file being in a second language, the second application file having a same structure and providing a same function as the first application file, but the same function being provided in the second language by the second application file;
  accessing one or more first internal files for the first application file and one or more second internal files for the second application file, the one or more first internal files being one or more files that are included within a first software code associated with the first application file and the one or more second internal files being one or more files that are included within a second software code associated with the second application file;
  comparing at least one of the one or more first internal files to one of the one or more second internal files to determine if the at least one of the one of the one or more first internal files is identical to the one of the one or more second internal files;
  upon determining that the at least one of the one of the one or more first internal files is not identical to the one of the one or more second internal files, perform at least one of:
    copying both of the at least one of the one of the one or more first internal files and the one of the one or more second internal files to the output folder, or
    executing a differencing procedure on the at least one of the one of the one or more first internal files and the one of the one or more second internal files to identify one or more differences between the at least one of the one of the one or more first internal files and the one of the one or more second internal files, and storing data about the one or more differences in the output folder; and compressing data stored in the output folder into one output file.

Item 2. The data processing system of item 1, wherein each of the first application file and the second application file are compressed files and the executable instructions when executed by the processor, further cause the device to perform functions of decompressing the first application file and the second application file to access to the one or more first internal files and the one or more second internal files.

Item 3. The data processing system of items 1 or 2, wherein compressing the data in the output file into the output file includes compressing the data into a ZIP output file.

Item 4. The data processing system of any preceding item, wherein the at least one of the one of the one or more first internal files and the one of the one or more second internal files are files having a same name for different locales.

Item 5. The data processing system of any preceding item, the executable instructions when executed by the processor, further cause the device to perform functions of:
  determining if the at least one of the one of the one or more first internal files is identical to the one of the one or more second internal files; and
  upon determining that the at least one of the one of the one or more first internal files is identical to the one of the one or more second internal files, copying the at least one of the one of the one or more first internal files to an output folder.

Item 6. The data processing system of any preceding item, wherein the output folder includes at least one of a Shared folder, a Diff folder, a language-specific folder for the first language and a language specific folder for the second language.

Item 7. The data processing system of any preceding item, wherein the differencing procedure is an XML differencing procedure.

Item 8. The data processing system of item 7, wherein the XML differencing procedure comprises:
  selecting one of the one or more first internal files as a base file;
  comparing the one of the one or more second internal files to the base file; and storing one or more differences between the base file and the one of the one or more second internal files to a diff file.

Item 9. The data processing system of any preceding item, wherein the executable instructions when executed by the processor, further cause the device to perform functions of:
  upon receiving a request to open the first application file, after the output file is compressed:
    extracting one or more internal output files from the output file;
    creating a root folder;
    copying one or more files from a shared folder in the extracted one or more internal output files to the root folder;
    copying one or more files from a first language folder in the extracted one or more internal output files to the root folder;
    determining if a diff file exists among the extracted one or more internal output files;
    upon determining that a diff file exits, processing information in the diff file to recreate an internal XML files; and
    compressing one or more files in the root folder to recreate a copy of the first application file.

Item 10. A method for compressing a first application file and second application file, comprising:
  accessing the first application file and the second application file, the first application file being in a first language and the second application file being in a second language, the second application file having a same structure and providing a same function as the first application file, but the same function being provided in the second language by the second application file;
  accessing one or more first internal files for the first application file and one or more second internal files for the second application file, the one or more first internal files being one or more files that are included within a first software code associated with the first application file and the one or more second internal files being one or more files that are included within a second software code associated with the second application file;
  comparing at least one of the one or more first internal files to one of the one or more second internal files to determine if the at least one of the one of the one or more first internal files is identical to the one of the one or more second internal files;

upon determining that the at least one of the one of the one or more first internal files is not identical to the one of the one or more second internal files, perform at least one of:

copying both of the at least one of the one of the one or more first internal files and the one of the one or more second internal files to the output folder, or executing a differencing procedure on the at least one of the one of the one or more first internal files and the one of the one or more second internal files to identify one or more differences between the at least one of the one of the one or more first internal files and the one of the one or more second internal files, and storing data about the one or more differences in the output folder; and compressing data stored in the output folder into one output file.

Item 11. The method of item 10, wherein the at least one of the one of the one or more first internal files and the one of the one or more second internal files are files having a same name for different locales.

Item 12. The method of items 10 or 11, wherein the differencing procedure is an XML differencing procedure.

Item 13. The method of item 11, wherein the XML differencing procedure comprises:

selecting one of the one or more first internal files as a base file;

comparing the one of the one or more second internal files to the base file; and storing one or more differences between the base file and the one of the one or more second internal files to a diff file.

Item 14. The method of any of items 10-13, further comprising:

upon receiving a request to open the first application file after the output file is compressed:

extracting one or more internal output files from the output file;

creating a root folder;

copying one or more files from a shared folder in the extracted one or more internal output files to the root folder;

copying one or more files from a first language folder in the extracted one or more internal output files to the root folder;

determining if a diff file exists among the extracted one or more internal output files;

upon determining that a diff file exits, processing information in the diff file to recreate an internal XML files; and compressing one or more files in the root folder to recreate a copy of the first application file.

Item 15. The method of any of items 10-14, wherein each of the first application file and the second application file are compressed files and further comprising decompressing the first application file and the second application file to access to the one or more first internal files and the one or more second internal files.

Item 16. A non-transitory computer readable medium on which are stored instructions that, when executed, cause a programmable device to:

access a first application file and a second application file, the first application file being in a first language and the second application file being in a second language, the second application file having a same structure and providing a same function as the first application file, but the same function being provided in the second language by the second application file;

access one or more first internal files for the first application file and one or more second internal files for the second application file, the one or more first internal files being one or more files that are included within a first software code associated with the first application file and the one or more second internal files being one or more files that are included within a second software code associated with the second application file;

compare at least one of the one or more first internal files to one of the one or more second internal files to determine if the at least one of the one of the one or more first internal files is identical to the one of the one or more second internal files;

upon determining that the at least one of the one of the one or more first internal files is not identical to the one of the one or more second internal files, perform at least one of:

copy both of the at least one of the one of the one or more first internal files and the one of the one or more second internal files to the output folder, or execute a differencing procedure on the at least one of the one of the one or more first internal files and the one of the one or more second internal files to identify one or more differences between the at least one of the one of the one or more first internal files and the one of the one or more second internal files, and storing data about the one or more differences in the output folder; and compress data stored in the output folder into one output file.

Item 17. The computer readable medium of item 16, wherein the at least one of the one of the one or more first internal files and the one of the one or more second internal files are files having a same name for different locales.

Item 18. The computer readable medium of any of items 16-17, wherein the differencing procedure is an XML differencing procedure.

Item 19. The computer readable medium of item 18, wherein the XML differencing procedure comprises:

selecting one of the one or more first internal files as a base file;

comparing the one of the one or more second internal files to the base file; and storing one or more differences between the base file and the one of the one or more second internal files to a diff file.

Item 20. The computer readable medium of any of items 16-19, wherein the instructions further cause the programmable device to:

upon receiving a request to open the first application file:

extracting one or more internal output files from the output file;

creating a root folder;

copying one or more files from a shared folder in the extracted one or more internal output files to the root folder;

copying one or more files from a first language folder in the extracted one or more internal output files to the root folder;

determining if a diff file exists among the extracted one or more internal output files;

upon determining that a diff file exits, processing information in the diff file to recreate an internal XML files; and compressing one or more files in the root folder to recreate a copy of the first application file.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows, and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein.

Relational terms such as first and second and the like may be used solely to distinguish one entity or action from another without necessarily requiring or implying any actual such relationship or order between such entities or actions. The terms "comprises," "comprising," and any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that comprises the element.

The Abstract of the Disclosure is provided to allow the reader to quickly identify the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that any claim requires more features than the claim expressly recites. Rather, as the following claims reflect, inventive subject matter lies in less than all features of a single disclosed example. Thus, the following claims are hereby incorporated into the Detailed Description, with each claim standing on its own as a separately claimed subject matter.

What is claimed is:

1. A data processing system comprising:
a processor; and
a memory in communication with the processor, the memory comprising executable instructions that, when executed by the processor, cause the data processing system to perform functions of:
  accessing a first application file and a second application file, the first application file being in a first language and the second application file being in a second language, the second application file having a same structure and providing a same function as the first application file, but the same function being provided in the second language by the second application file;
  accessing one or more first internal files for the first application file and one or more second internal files for the second application file, the one or more first internal files being one or more files that are included within a first software code associated with the first application file and the one or more second internal files being one or more files that are included within a second software code associated with the second application file;
  comparing at least one of the one or more first internal files to one of the one or more second internal files;
  determining, based on the comparison, if the at least one of the one of the one or more first internal files is identical to the one of the one or more second internal files;
  upon determining that the at least one of the one of the one or more first internal files is identical to the one of the one or more second internal files, copying the at least one of the one of the one or more first internal files to an output folder;
  upon determining that the at least one of the one of the one or more first internal files is not identical to the one of the one or more second internal files, performing at least one of:
    copying both of the at least one of the one of the one or more first internal files and the one of the one or more second internal files to the output folder, or
    executing a differencing procedure on the at least one of the one of the one or more first internal files and the one of the one or more second internal files to identify one or more differences between the at least one of the one of the one or more first internal files and the one of the one or more second internal files, and storing data about the one or more differences in the output folder; and compressing data stored in the output folder into one output file.

2. The data processing system of claim 1, wherein each of the first application file and the second application file are compressed files and the executable instructions when executed by the processor, further cause the data processing system to perform functions of decompressing the first application file and the second application file to access to the one or more first internal files and the one or more second internal files.

3. The data processing system of claim 1, wherein compressing the data in the output file into the output file includes compressing the data into a ZIP output file.

4. The data processing system of claim 1, wherein the at least one of the one of the one or more first internal files and the one of the one or more second internal files are files having a same name for different locales.

5. The data processing system of claim 1, wherein the output folder includes at least one of a Shared folder, a Diff folder, a language-specific folder for the first language and a language specific folder for the second language.

6. The data processing system of claim 1, wherein the differencing procedure is an XML differencing procedure.

7. The data processing system of claim 6, wherein the XML differencing procedure comprises:
  selecting one of the one or more first internal files as a base file;
  comparing the one of the one or more second internal files to the base file; and
  storing one or more differences between the base file and the one of the one or more second internal files to a diff file.

8. The data processing system of claim 1, wherein the executable instructions when executed by the processor, further cause the data processing system to perform functions of:
  upon receiving a request to open the first application file, after the output file is compressed:
    extracting one or more internal output files from the output file;
    creating a root folder;
    copying one or more files from a shared folder in the extracted one or more internal output files to the root folder;
    copying one or more files from a first language folder in the extracted one or more internal output files to the root folder;
    determining if a diff file exists among the extracted one or more internal output files;
    upon determining that a diff file exits, processing information in the diff file to recreate an internal XML, files; and
    compressing one or more files in the root folder to recreate a copy of the first application file.

9. A method for compressing a first application file and second application file, comprising:
  accessing the first application file and the second application file, the first application file being in a first language and the second application file being in a second language, the second application file having a same structure and providing a same function as the first application file, but the same function being provided in the second language by the second application file;
  accessing one or more first internal files for the first application file and one or more second internal files for the second application file, the one or more first internal files being one or more files that are included within a first software code associated with the first application file and the one or more second internal files being one or more files that are included within a second software code associated with the second application file;
  comparing at least one of the one or more first internal files to one of the one or more second internal files;
  determining, based on the comparison, if the at least one of the one of the one or more first internal files is identical to the one of the one or more second internal files;
  based on the determination, copying the at least one of the one of the one or more first internal files to an output folder, when the at least one of the one of the one or more first internal files is identical to the one of the one or more second internal files, and when the at least one of the one of the one or more first internal files is not identical to the one of the one or more second internal files, performing at least one of:
    copying both of the at least one of the one of the one or more first internal files and the one of the one or more second internal files to the output folder, or
    executing a differencing procedure on the at least one of the one of the one or more first internal files and the one of the one or more second internal files to identify one or more differences between the at least one of the one of the one or more first internal files and the one of the one or more second internal files, and storing data about the one or more differences in the output folder; and compressing data stored in the output folder into one output file.

10. The method of claim 9, wherein the at least one of the one of the one or more first internal files and the one of the one or more second internal files are files having a same name for different locales.

11. The method of claim 9, wherein the differencing procedure is an XML differencing procedure.

12. The method of claim 10, wherein the XML differencing procedure comprises:
  selecting one of the one or more first internal files as a base file;
  comparing the one of the one or more second internal files to the base file; and
  storing one or more differences between the base file and the one of the one or more second internal files to a diff file.

13. The method of claim 9, further comprising:
  upon receiving a request to open the first application file after the output file is compressed:
    extracting one or more internal output files from the output file;
    creating a root folder;
    copying one or more files from a shared folder in the extracted one or more internal output files to the root folder;
    copying one or more files from a first language folder in the extracted one or more internal output files to the root folder;
    determining if a diff file exists among the extracted one or more internal output files;
    upon determining that a diff file exits, processing information in the diff file to recreate an internal XML files; and
    compressing one or more files in the root folder to recreate a copy of the first application file.

14. The method of claim 9, wherein each of the first application file and the second application file are compressed files and further comprising decompressing the first application file and the second application file to access to the one or more first internal files and the one or more second internal files.

15. A non-transitory computer readable medium on which are stored instructions that, when executed, cause a programmable device to:
  access a first application file and a second application file, the first application file being in a first language and the second application file being in a second language, the second application file having a same structure and providing a same function as the first application file, but the same function being provided in the second language by the second application file;

access one or more first internal files for the first application file and one or more second internal files for the second application file, the one or more first internal files being one or more files that are included within a first software code associated with the first application file and the one or more second internal files being one or more files that are included within a second software code associated with the second application file;

compare at least one of the one or more first internal files to one of the one or more second internal files;

determine, based on the comparison, if the at least one of the one of the one or more first internal files is identical to the one of the one or more second internal files;

upon determining that the at least one of the one of the one or more first internal files is identical to the one of the one or more second internal files, copy the at least one of the one of the one or more first internal files to an output folder;

upon determining that the at least one of the one of the one or more first internal files is not identical to the one of the one or more second internal files, perform at least one of:

copy both of the at least one of the one of the one or more first internal files and the one of the one or more second internal files to the output folder, or execute a differencing procedure on the at least one of the one of the one or more first internal files and the one of the one or more second internal files to identify one or more differences between the at least one of the one of the one or more first internal files and the one of the one or more second internal files, and storing data about the one or more differences in the output folder; and compress data stored in the output folder into one output file.

16. The computer readable medium of claim 15, wherein the at least one of the one of the one or more first internal files and the one of the one or more second internal files are files having a same name for different locales.

17. The computer readable medium of claim 15, wherein the differencing procedure is an XML differencing procedure.

18. The computer readable medium of claim 17, wherein the XML, differencing procedure comprises:

selecting one of the one or more first internal files as a base file;

comparing the one of the one or more second internal files to the base file; and storing one or more differences between the base file and the one of the one or more second internal files to a diff file.

19. The computer readable medium of claim 15, wherein the instructions further cause the programmable device to:

upon receiving a request to open the first application file:

extracting one or more internal output files from the output file;

creating a root folder;

copying one or more files from a shared folder in the extracted one or more internal output files to the root folder;

copying one or more files from a first language folder in the extracted one or more internal output files to the root folder;

determining if a diff file exists among the extracted one or more internal output files;

upon determining that a diff file exits, processing information in the diff file to recreate an internal XML files; and compressing one or more files in the root folder to recreate a copy of the first application file.

\* \* \* \* \*